(12) United States Patent
Stokes et al.

(10) Patent No.: US 7,687,971 B2
(45) Date of Patent: Mar. 30, 2010

(54) ELECTRIC FIELD CONTROL OF SURFACE ACOUSTIC WAVE VELOCITY

(75) Inventors: Robert Bruce Stokes, Rancho Palos Verdes, CA (US); Alvin Ming-Wei Kong, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 194 days.

(21) Appl. No.: 11/504,372

(22) Filed: Aug. 15, 2006

(65) Prior Publication Data

US 2008/0042517 A1  Feb. 21, 2008

(51) Int. Cl.
*H01L 41/047* (2006.01)
(52) U.S. Cl. .............................. 310/313 B; 310/313 R
(58) Field of Classification Search ............. 310/313 R, 310/313 A, 313 B, 313 C, 313 D
See application file for complete search history.

(56) References Cited

U.S. PATENT DOCUMENTS

| | | | |
|---|---|---|---|
| 4,233,573 A | 11/1980 | Grudkowski | |
| 4,354,166 A | 10/1982 | Grudkowski | |
| 4,401,956 A | 8/1983 | Joshi | |
| 5,329,256 A | 7/1994 | Higgins, Jr. | |
| 5,343,175 A | 8/1994 | Davenport | |
| 5,365,207 A | 11/1994 | Borras | |
| 5,426,340 A * | 6/1995 | Higaki et al. | 310/313 R |
| 5,757,250 A | 5/1998 | Ichikawa | |
| 5,959,388 A | 9/1999 | Graebner | |
| 6,049,155 A | 4/2000 | Graebner | |
| 6,285,865 B1 | 9/2001 | Vorenkamp | |
| 6,426,680 B1 | 7/2002 | Duncan | |
| 6,541,893 B2 | 4/2003 | Zhu | |
| 6,549,766 B2 | 4/2003 | Vorenkamp | |
| 6,559,736 B2 * | 5/2003 | Lu et al. | 333/152 |
| 6,621,192 B2 | 9/2003 | Lu | |
| 6,664,871 B2 | 12/2003 | Yip | |
| 6,710,515 B2 | 3/2004 | Lu | |
| 6,803,829 B2 | 10/2004 | Duncan | |

OTHER PUBLICATIONS

A.C. Anderson et al.; Attentuating Thin Films for Saw Devices; Ultrasonics Symposium; 1980; pp. 442-445; Lincoln Laboratory, Massachusetts Institute of Technology Lexington, Massachusetts, US.

* cited by examiner

*Primary Examiner*—Walter Benson
*Assistant Examiner*—Derek J Rosenau
(74) *Attorney, Agent, or Firm*—Carmen Patti Law Group, LLC

(57) ABSTRACT

An apparatus in one example comprises a piezoelectric layer, a first electrode along a first side of the piezoelectric layer, and a second electrode along a second side of the piezoelectric layer. The first and second electrodes are adapted to receive a voltage bias to create an electric field in the piezoelectric layer that controls an acoustic velocity of a surface acoustic wave.

25 Claims, 7 Drawing Sheets

ELECTRIC FIELD CONTROL OF SURFACE ACOUSTIC WAVE VELOCITY

TECHNICAL FIELD

The invention relates generally to surface acoustic wave devices and more particularly to control of acoustic velocity in surface acoustic wave devices.

BACKGROUND

Known Surface Acoustic Wave ("SAW") devices often utilize input and output interdigital transducers (IDTs) spaced apart from each other on the surface of a solid with piezoelectric properties. In one example, the solid comprises a single crystal of a piezoelectric material, such as quartz. In another example, the solid comprises one or more thin films, some which are piezoelectric, deposited on a non-piezoelectric single crystal substrate. The input IDT converts an input electrical signal to a surface acoustic wave in the SAW device. The surface acoustic wave propagates along the surface of the solid to the output IDT. The output IDT converts the surface acoustic wave to an output electrical signal. The propagation path along the surface of the solid serves as a delay path for the surface acoustic wave. It takes a certain amount of time for the surface acoustic wave to travel from the input IDT to the output IDT. The amount of time is dependent on the material properties of the solid and the acoustic path length between the input and output IDTs.

The center frequency of a SAW device is based on the geometry of the IDTs. After the solid and IDTs have been formed and integrated into a SAW device, the center frequency of the SAW device is fixed. To produce a SAW device with a different center frequency, a designer could either select a different solid material configuration or a different IDT geometry for the SAW device. In one example, the designer could select a piezoelectric crystal with a different acoustic velocity to change the center frequency of the SAW device. In another example, the designer could change the geometry of the IDTs on the piezoelectric layer to change the center frequency of the SAW device. As one shortcoming, the center frequency of such SAW devices is fixed at fabrication. The ability to frequency tune SAW devices in prior attempts has been limited.

Thus, a need exists for improved control of the acoustic velocity of a surface acoustic wave on the surface of the solid in a SAW device.

SUMMARY

The invention in one implementation encompasses an apparatus. The apparatus comprises a piezoelectric layer, a first electrode along a first side of the piezoelectric layer, and a second electrode along a second side of the piezoelectric layer. The first and second electrodes are adapted to receive a voltage bias to create an electric field in the piezoelectric layer that controls an acoustic velocity of a surface acoustic wave.

Another implementation of the invention encompasses a method. A surface acoustic wave is introduced into a solid that comprises a piezoelectric layer. A voltage bias is applied between a first electrode along a first side of the piezoelectric layer and a second electrode along a second side of the piezoelectric layer to create an electric field in the piezoelectric layer that controls an acoustic velocity of the surface acoustic wave.

Yet another implementation of the invention encompasses a method. A first layer of piezoelectric semiconductor material is formed on a substrate to be conductive. A second layer of piezoelectric semiconductor material is formed on the first layer to be insulating. A third layer of piezoelectric semiconductor material is formed on the second layer to be conductive. An input transducer is placed on the third layer for introduction of a surface acoustic wave. An electrical path is provided between a voltage bias source and the first and third layers for creation of an electric field in the second layer that controls an acoustic velocity of the surface acoustic wave.

DESCRIPTION OF THE DRAWINGS

Features of example implementations of the invention will become apparent from the description, the claims, and the accompanying drawing in which:

DETAILED DESCRIPTION

Figure 1:
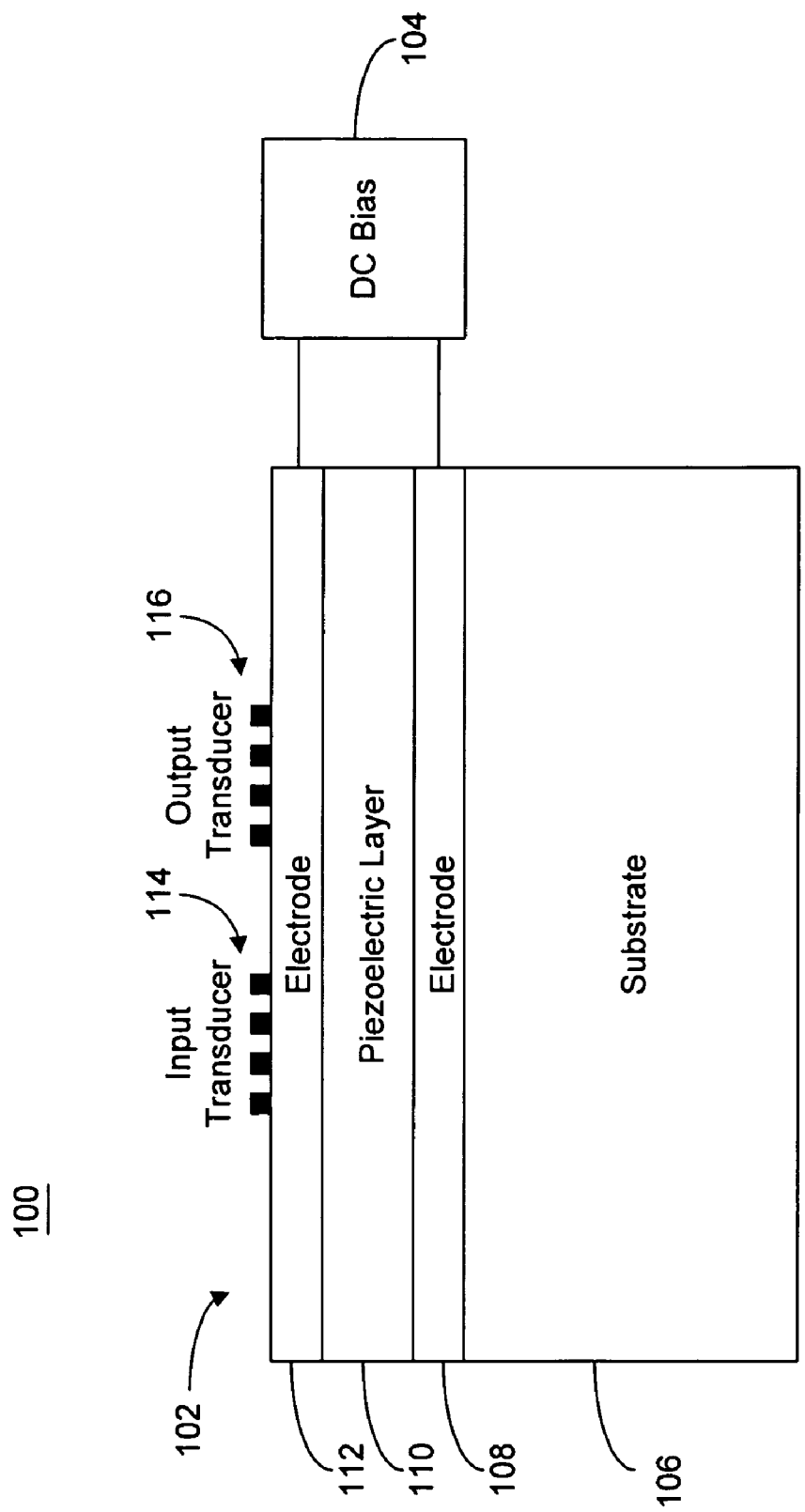
FIG. 1 is a representation of one implementation of an apparatus that comprises a surface acoustic wave device and a direct current bias source that provides a bias between two electrodes in the surface acoustic wave device to create an electric field in a piezoelectric layer of the surface acoustic wave device.

Turning to FIG. 1, an apparatus 100 in one example comprises a surface acoustic wave ("SAW") device 102 and a direct current ("DC") voltage bias source 104. The SAW device 102 in one example comprises a substrate 106, an electrode 108, a piezoelectric layer 110, an electrode 112, an input transducer 114, and an output transducer 116. The DC voltage bias source 104 provides a DC bias between the electrode 108 and the electrode 112 to create an electric field in the piezoelectric layer 110. The top electrode 112 in one example is maintained at the same average voltage as the transducers, so that the potential across the top surface of the device has an approximately uniform potential. The electrodes 108 and 112 provide a uniform electric field biasing of the piezoelectric layer 110. The electric field is employable to control an acoustic velocity of a surface acoustic wave, as the electric field perturbs the material properties of the piezoelectric layer 110 through the piezoelectric effect which in turn modifies the wave propagation physics, in one example resulting in an approximately linear relation between the electric field and the deviation from the unbiased acoustic velocity. Therefore, the electric field is employable to tune a center frequency of the SAW device 102. The SAW device 102 may comprise a SAW filter, SAW resonator, SAW delay line, or the like.

The substrate 106 serves to provide a surface for formation of thin single crystal films. For example, the substrate 106 supports the piezoelectric layer 110 and the electrodes 108 and 112. One or more intermediate layers in one example may be positioned between the substrate 106 and the electrode 108 to facilitate growth of the electrode 108 on the substrate layer 106, as will be appreciated by those skilled in the art. The substrate 106 in one example comprises a crystal with high acoustic velocity and low loss, such as a c-plane sapphire. In another example, the substrate 106 may comprise silicon carbide. The size of the substrate 106 may vary based on the selected material and/or the intended application. In one example, the substrate 106 comprises a 40 to 500 micrometer thick c-plane sapphire substrate layer.

The piezoelectric layer 110 works with the IDTs to convert between electrical and acoustic power, so that the IDTs can launch and detect surface acoustic waves. For example, during operation of the SAW device 102 an electrical signal is applied to the input transducer 114 which causes a surface acoustic wave to propagate in the SAW device 102, as will be appreciated by those skilled in the art. The output transducer 116 later converts the propagated acoustic wave into an output electrical signal, as will be appreciated by those skilled in the art. The piezoelectric layer 110 in one example comprises a material that has both semiconductor and piezoelectric properties, such as gallium nitride or aluminum nitride. The thickness of the piezoelectric layer 110 may vary based on the selected material and the intended application. For example, the thickness of the piezoelectric layer 110 may be between 0.1 and ten micrometers. In one example, the piezoelectric layer 110 comprises a one micrometer thick gallium nitride layer. The piezoelectric layer 110 in one example is deposited without doping so it is substantially insulating. In one example, the piezoelectric layer 110 comprises a sheet resistivity of approximately $1 \times 10^{10}$ ohms per square or more. The resistivity of the piezoelectric layer 110 in one example is at least ten times greater than the resistivity of the electrodes 108 and 112.

The electrodes 108 and 112 are located along sides of the piezoelectric layer 110. For example, the electrode 108 is located along a first side of the piezoelectric layer 110 and the electrode 112 is located along a second side of the piezoelectric layer 110. The electrodes 108 and 112 in one example are located along opposite sides of the piezoelectric layer 110, such as the top and bottom surfaces of the piezoelectric layer 110. In one example, the electrodes 108 and 112 abut the piezoelectric layer. In another example, one or more other layers are located between the electrodes 108 and 112 and the piezoelectric layer 110.

The electrodes 108 and 112 in one example comprise slightly conductive doped layers of gallium nitride or aluminum nitride. The size of the electrodes 108 and 112 may vary based on the selected material and the intended application. For example, the thickness of the electrodes 108 and 112 may be between 0.05 and two micrometers. In one example, the electrodes 108 and 112 each comprise a 1000 angstroms thick lightly doped gallium nitride layer. The electrodes 108 and 112 in one example are substantially insulating while having enough conductivity to receive a DC bias and to generate an electric field in the piezoelectric layer 110. While the electrodes 108 and 112 in this example are conductive enough to receive the DC bias, the electrode 112 is insulating enough to prevent a short circuit between adjacent fingers inside the input and output transducers 114 and 116. Also in this example, the resistivity of the electrodes 108 and 112 must be high enough to prevent severe SAW propagation loss due to currents induced to flow by the electric field of the wave. The level of resistivity of the electrodes 108 and 112 in one example is controlled by the amount of dopant added to the electrodes 108 and 112. In one example, the starting material for the electrodes 108 and 112 is substantially insulating before the dopants are added to reduce the resistivity of the electrodes 108 and 112. The resistivity of the electrodes 108 and 112 in one example is at least ten times lower than the resistivity of the piezoelectric layer 110. In one example, the electrodes 108 and 112 comprise a sheet resistivity of approximately $1 \times 10^{8}$ ohms per square.

In one configuration, the electrodes 108 and 112 have the same sheet resistivity. In an alternate configuration, the electrode 112 has a sheet resistivity of approximately $1 \times 10^{8}$ ohms per square while the electrode 108 is more conductive. In this configuration, the resistivity of the electrode 108 is low enough to prevent excessive propagation loss through resistive loss of currents induced by the electric field of the wave. For example, the electrode 108 in this configuration may have a sheet resistivity of $1 \times 10^{4}$ ohms per square or lower. In another configuration, the electrode 108 comprises a layer of metal or other conducting material.

The electrodes 108 and 112 serve to create an electric field in the piezoelectric layer 110 for tuning a center frequency of the SAW device 102. Because of the piezoelectric properties of the piezoelectric layer 110, the piezoelectric layer 110 converts the electric field into mechanical strain. Therefore, when an electric field is applied to the piezoelectric layer 110, the shape of the piezoelectric layer 110 is altered which changes the mechanical, piezoelectric, and dielectric properties of the piezoelectric layer 110. The change in these properties of the piezoelectric layer in turn causes a change in the velocity of the surface acoustic wave. By controlling the acoustic velocity of surface acoustic waves, the center frequency of the SAW device 102 can be controlled.

The electric field created by the electrodes 108 and 112 in one example is substantially perpendicular to the surface of the piezoelectric layer 110. Depending on the direction of the applied electric field, the acoustic velocity of a surface acoustic wave can be either increased or decreased from a baseline velocity. When the electrodes 108 and 112 are at a same voltage level, then the acoustic velocity of a surface acoustic wave is at the baseline velocity. For example, the baseline velocity is determined by the material properties of the piezoelectric layer 110, the other thin film layers such as the electrodes 108 and 112, and the substrate 106, as will be appreciated by those skilled in the art. When a first one of the electrodes 108 and 112 is at a voltage level that is higher than a voltage level at a second one of the electrodes 108 and 112, then the electric field is directed from the first one of the electrodes 108 and 112 to the second one of the electrodes 108 and 112 and the acoustic velocity of the surface acoustic wave is higher than the baseline velocity. When a first one of the electrodes 108 and 112 is at a voltage level that is lower than a voltage level at a second one of the electrodes 108 and 112, then the electric field is directed from the second one of the electrodes 108 and 112 to the first one of the electrodes 108 and 112 and the acoustic velocity of the surface acoustic wave is lower than the baseline velocity.

As is known in the art, a piezoelectric material comprises a first polarity and a second polarity, where the first polarity is opposite of the second polarity. The polarity of the piezoelectric layer 110 in one example is based on a crystal orientation of the piezoelectric layer when it is deposited on the electrode 108. For example, applying a higher voltage level at a first electrode than a second electrode for the first polarity of the piezoelectric layer is substantially equivalent to applying a higher voltage level at the second electrode than the first electrode for the second polarity of the piezoelectric layer. Also, applying a higher voltage level at the second electrode than the first electrode for the first polarity of the piezoelectric layer is substantially equivalent to applying a higher voltage level at the first electrode than the second electrode for the second polarity of the piezoelectric layer, as will be appreciated by those skilled in the art.

As the acoustic velocity of the surface acoustic wave is modified by the electric field, the center frequency of the SAW device 102 is also modified. In one example, an electric field directed from the electrode 108 to the electrode 112 may increase the center frequency of the SAW device 102 while an electric field directed from the electrode 112 to the electrode 108 may decrease the center frequency of the SAW device 102. In another example, an electric field directed from the electrode 108 to the electrode 112 may decrease the center frequency of the SAW device 102 while an electric field directed from the electrode 112 to the electrode 108 may increase the center frequency of the SAW device 102.

The SAW device 102 in one example comprises one or more groove reflectors to form a SAW resonator. For example, the groove reflectors form an acoustic resonant cavity for a surface acoustic wave. The electrodes 108 and 112 are adapted to receive the DC bias to create the electric field in the piezoelectric layer 110 that controls a center frequency of the SAW resonator. A change to the DC bias received at the electrode 108 or the electrode 112 results in a change in strength of the electric field in the piezoelectric layer 110 and a change to the center frequency of the SAW resonator.

Figure 2:
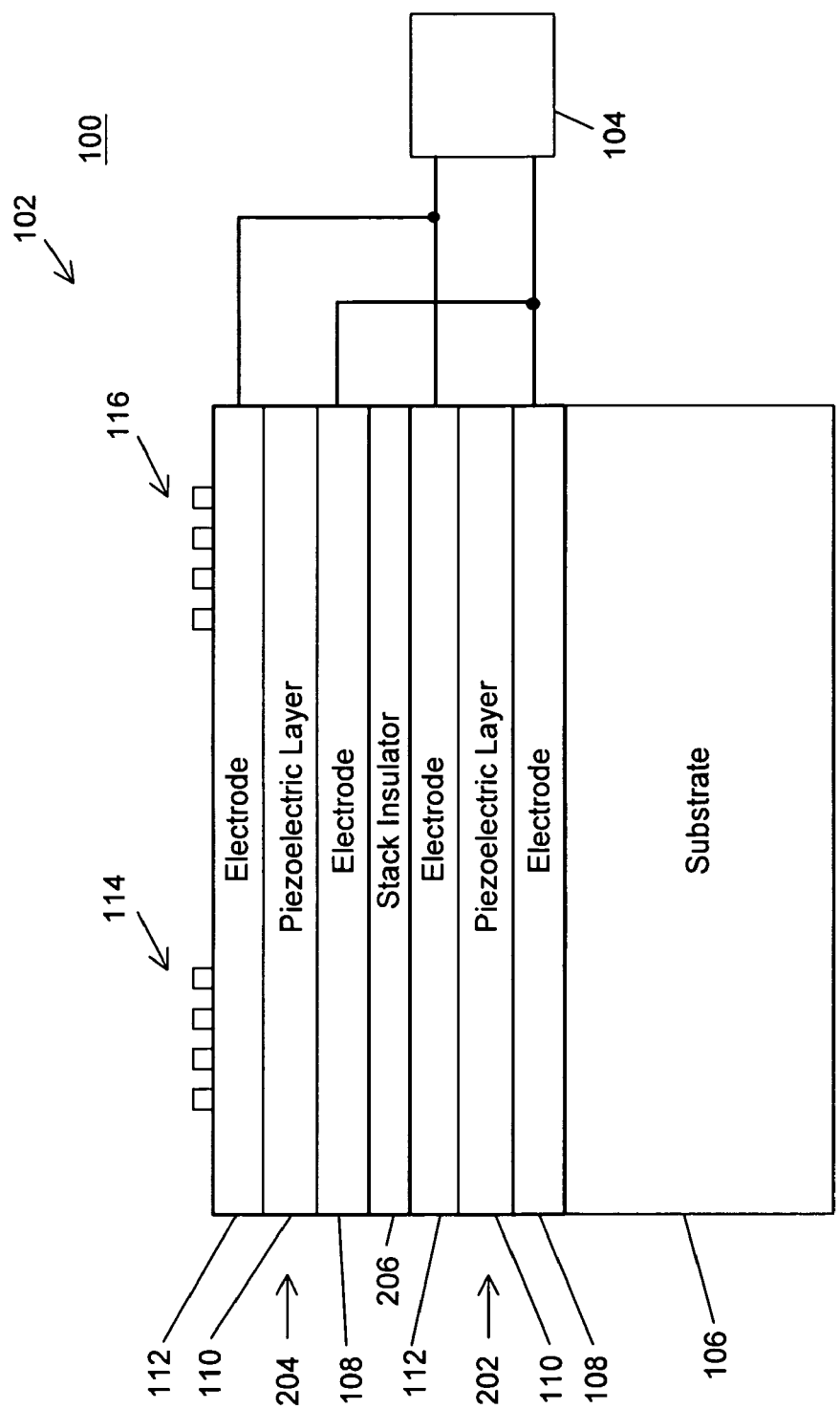
FIG. 2 is a representation of another implementation of the surface acoustic wave device and the direct current bias source that provides a bias between two electrodes of each of two electrode stacks in the surface acoustic wave device.
Figure 3:
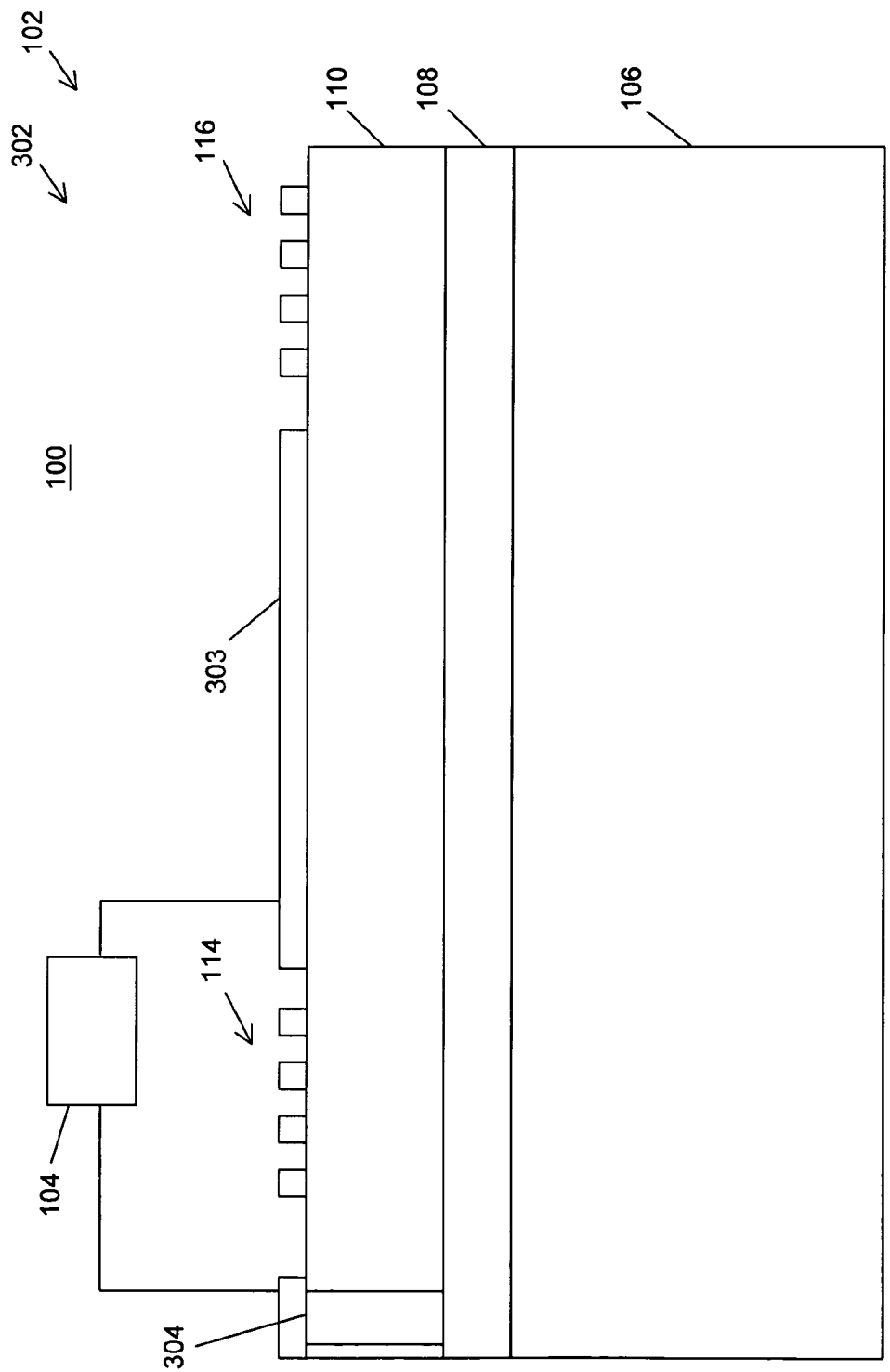
FIG. 3 is a representation of one implementation of the surface acoustic wave device that comprises an adjustable delay line.

Turning to FIG. 2, the SAW device 102 in another example comprises the substrate 106, the input transducer 114, the output transducer 116, a first electrode stack 202, a second electrode stack 204, and a stack insulator 206. Each of the first and second electrode stacks 202 and 204 in one example comprise an electrode 108, a piezoelectric layer 110, and an electrode 112. In one example, the piezoelectric layer 110 of FIG. 1 is divided into two pieces, for example, into the two piezoelectric layers 110 of the first and second electrode stacks 202 and 204. The first electrode stack 202 in one example is formed on the substrate 106. The stack insulator 206 in one example is formed on top of the first electrode stack 202 and between the first electrode stack 202 and the second electrode stack 204. The piezoelectric layer 110 of the first electrode stack 202 and the piezoelectric layer 110 of the second electrode stack 204 in one example comprises a same crystal orientation or polarity. The input transducer 114 and the output transducer 116 in one example are formed on top of the second electrode stack 204. In one embodiment, the electrodes 108 and 112 of the first electrode stack 202 and the electrode 108 of the second electrode stack 204 in one example are coupled with the DC bias voltage source 104 by one or more via structures (e.g., the via 304 as shown in FIG. 3).

The piezoelectric layers 110 of the electrode stacks 202 and 204 in one example comprise a combined thickness of approximately 1.0 micron, or approximately 0.5 microns each. The stack insulator 206 in one example comprises a substantially non-piezoelectric insulating material. In another example, the stack insulator 206 comprises a weaker piezoelectric effect than the electrodes 108 and 112. The stack insulator 206 in one example serves to insulate the electrode 112 of the first electrode stack 202 from the electrode 108 of the second electrode stack 204. Examples of materials for the stack insulator 206 that may be selected by one skilled in the art comprise nitride materials.

Referring to FIG. 2, the example with the first and second electrode stacks 202 and 204 in one example comprises a lower DC bias voltage for a similar electric field strength compared to the example of FIG. 1. For example, where the piezoelectric layer 110 of the first and second electrode stacks 202 and 204 comprise a thickness of 0.5 microns each, the voltage bias is approximately one half of the voltage bias of a single piezoelectric layer 110 with a thickness of 1.0 micron. In a further example, a plurality of electrode stacks are formed to reduce the voltage bias.

An illustrative description of one method available to make the electrically tunable SAW device 102 in the configurations of FIG. 1 or 2 is now presented, for explanatory purposes. The layers 108, 110, and 112 in one example are formed together as an integral layer on the substrate 106. For example, the layers 108, 110, and 112 are deposited as a thin film on the substrate 106. The layers 108, 110, and 112 in one example are formed as a single integral crystal on the substrate 106 by molecular beam epitaxy. Forming the layers 108, 110, and 112 as a single integral crystal in one example produces a piezoelectric layer with a strong level of piezoelectricity. The molecular beam epitaxy machine allows adjustments to the level of dopants added to the base material (e.g., gallium nitride) as the thin film is deposited, as will be appreciated by those skilled in the art. Materials such as gallium nitride are both piezoelectric and semiconducting. Therefore, they can be controlled to be either highly insulating to take advantage of the piezoelectricity, or partly conductive to serve as electrodes.

The first layer to be deposited on the substrate 106 is the electrode 108. The layers 108, 110, and 112 in one example are gallium nitride layers. Undoped gallium nitride is a substantially insulating material. To increase the conductivity of the electrode 108, the molecular beam epitaxy machine is set to add a light level of doping to the gallium nitride while the electrode 108 is being deposited. The amount of dopant added to the gallium nitride for the electrode 108 is sufficient to make the electrode 108 conductive enough to receive a voltage bias and create the electric field in the piezoelectric layer 110. The lightly doped gallium nitride is deposited on the substrate 106 to achieve a slightly conductive electrode of the desired thickness. In one example, the thickness of the electrode 108 is 1000 angstroms.

After the electrode 108 has been created on the substrate 106, the added dopant level of the molecular beam epitaxy machine is reduced. In one example, the molecular beam epitaxy machine is set to add no dopant to the gallium nitride while the piezoelectric layer 110 is being deposited. Next, the gallium nitride free of dopants is deposited on the electrode 108 to achieve an insulating layer of the desired thickness. In one example, the thickness of the piezoelectric layer 110 is one micrometer.

After the piezoelectric layer 110 has been created on the electrode 108, the molecular beam epitaxy machine is again adjusted to a provide light level of dopant to the gallium nitride. In one example, the dopant level used to create the electrode 112 may be set to the same level of dopant as used for the electrode 108. In another example, the dopant levels of the electrodes 108 and 112 may be different. The amount of dopant added to the gallium nitride for the electrode 112 is sufficient to make the electrode 112 conductive enough to receive a voltage bias and create the electric field in the piezoelectric layer 110 while also remaining insulating enough to prevent a short circuit between adjacent fingers in the input and output transducers 114 and 116, and insulating enough not to damp the surface acoustic wave through resistive loss of currents induced by the electric field of the wave. In one example, the thickness of the electrode 112 is 1000 angstroms.

In the example of FIG. 2, the stack insulator 206 is then deposited onto the electrode 112 of the electrode stack 202. The electrode stack 204 (e.g., another instance of the electrode 108, piezoelectric layer 110, and electrode 112) is then formed on top of the stack insulator 206. Additional electrode stacks may be added with respective stack insulators located between each other. The stack insulator 206 in one example comprises a crystal layer of substantially lower piezoelectricity than the piezoelectric layers 110.

After the layers 108, 110, and 112 (FIG. 1) or the plurality of electrode stacks 202 and 204 and the stack insulator 206 (FIG. 2) have been created on the substrate 106, the input and output transducers 114 and 116 in one example are added to the electrode 112 (or the electrode 112 of the electrode stack 204), as will be appreciated by those skilled in the art. In one example, the input and output transducers 114 and 116 comprise interdigital transducers ("IDTs"). Each of the input and output transducers 114 and 116 in one example are composed of quarter-wavelength wide fingers, with alternating polarities, with finger width and gap spacing of one micrometer and a finger length of 400 micrometers. Also after formation of the layers 108, 110, and 112, the DC voltage bias source 104 is connected to the electrodes 108 and 112. For example, an electrical path is provided between the DC voltage bias source 104 and the electrodes 108 and 112. A via structure (e.g., via 304 of FIG. 3) in one example is used to allow connection to the electrode 108.

An illustrative description of one method available to electrically tune the SAW device 102 is now presented, for explanatory purposes. A baseline acoustic velocity and center frequency of a SAW device in one example is fixed at fabrication. The baseline acoustic velocity of a SAW device is a property of a selected solid material configuration, which in one example comprises a particular substrate and additional thin films at the surface. The baseline center frequency of a SAW device is a function of the selected solid material configuration and a selected transducer geometry, as will be appreciated by those skilled in the art. Electric field tuning of the SAW device 102 serves to allow changes from the baseline acoustic velocity and center frequency of the SAW device 102.

A surface acoustic wave in one example is introduced into the SAW device 102. For example, an electrical signal applied to the input transducer 114 creates the surface acoustic wave in the SAW device 102. To allow electrical field tuning of the SAW device 102, the electrodes 108 and 112 are adapted to receive a DC voltage bias to create an electric field in the piezoelectric layer 110 that controls an acoustic velocity of the surface acoustic wave. Controlling the acoustic velocity of the surface acoustic wave controls the center frequency of the SAW device 102. The voltage bias is adjustable to allow adjustment of the electric field in the piezoelectric layer 110 which results in adjustment to the acoustic velocity and center frequency of the SAW device 102.

In one example, the acoustic velocity of the surface acoustic wave (or center frequency of the SAW device 102) is measured before application of the electric field to the piezoelectric layer 110. If the measured acoustic velocity is at the desired acoustic velocity level, then the electrodes 108 and 112 in one example do not need to create a electric field in the piezoelectric layer 110. However, if the current acoustic velocity is not at the desired acoustic velocity level, then a voltage bias can be applied to the electrodes 108 and/or 112 to create an electric field in the piezoelectric layer 110. In one example, the acoustic velocity of the surface acoustic wave is measured while the voltage bias is applied to the electrodes 108 and/or 112. If the measured acoustic velocity is at the desired acoustic velocity level, then the current level of voltage bias is held constant to maintain the measured acoustic velocity. However, if the measured acoustic velocity is not at the desired acoustic velocity level, then the voltage bias applied to the electrodes 108 and/or 112 can be changed until the desired acoustic velocity level is achieved.

Turning to FIG. 3, the SAW device 102 in another configuration comprises an adjustable delay line 302. The SAW device 102 of FIG. 3 illustrates an electrode 303 as an alternate configuration of the electrode 112. The electrode 303 in this configuration may comprise a metal, such as aluminum, or other conductive material. A via 304 connects the electrode 108 to the DC voltage bias source 104. The input transducer 114 and the output transducer 116 are placed on the piezoelectric layer 110 instead of on the electrode 303 (or electrode 112, as in FIGS. 1 and 2). For example, the input transducer 114 and the output transducer 116 are placed on opposing sides of the electrode 303 on the top surface of the piezoelectric layer 110. In this configuration, the electrode 303 is located in the delay path between the transducers 114 and 116 and the area of adjusted SAW velocity does not have a transducer over it. The electrode configuration of FIG. 3 allows a wider range of resistivity or conductance for the electrodes 108 and 303 since the transducers 114 and 116 are not located on top of the electrode 303, as will be appreciated by those skilled in the art. This electrode configuration may also be applied to other implementations of the SAW device 102, such as a SAW filter, SAW resonator, or the like.

Figure 4:
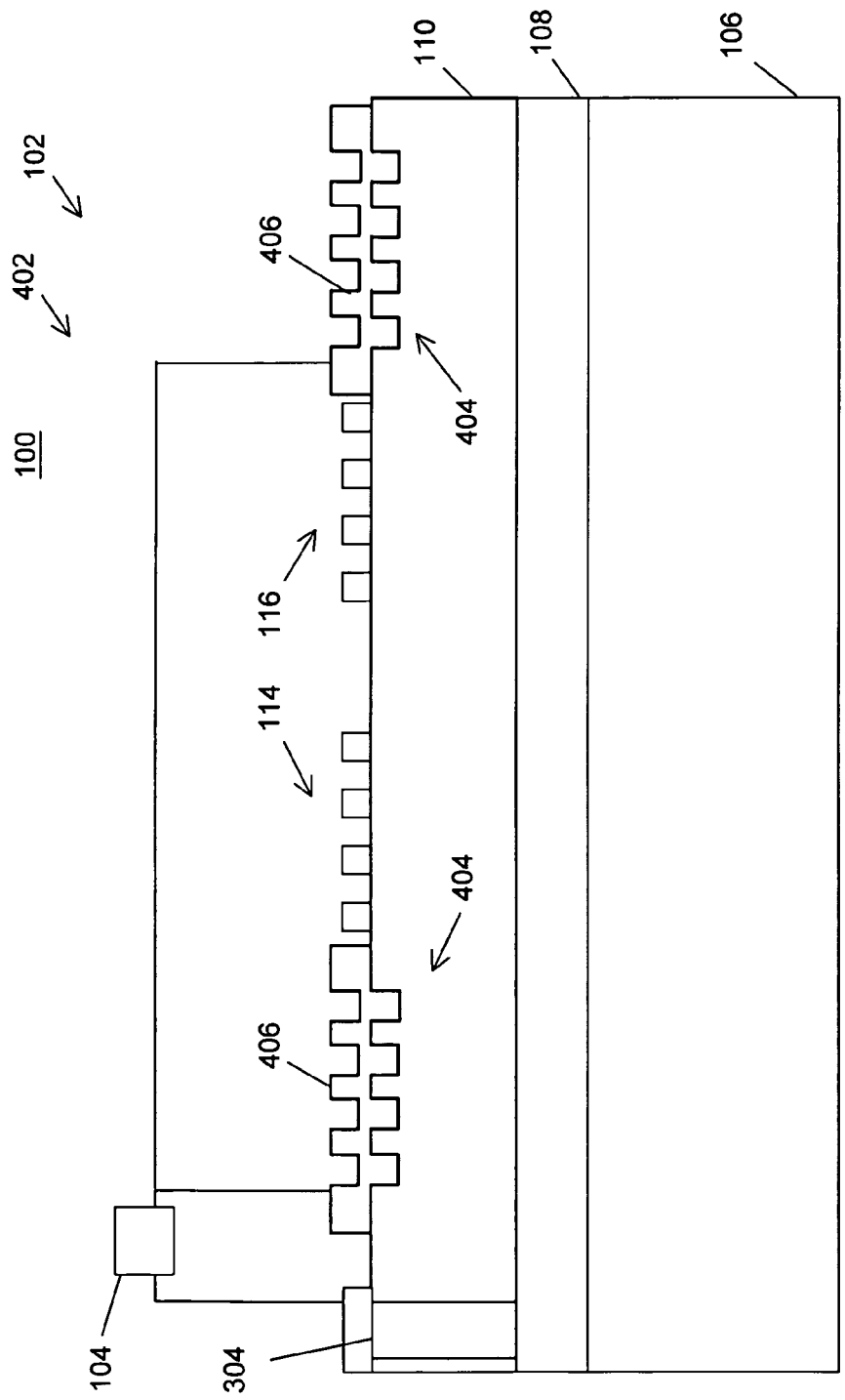
FIG. 4 is a representation of one implementation of the surface acoustic wave device that comprises a tunable resonator.

Turning to FIG. 4, the SAW device 102 in another configuration comprises a tunable resonator 402. The tunable resonator 402 comprises one or more reflectors, for example, groove reflectors 404. The groove reflectors 404 form an acoustic resonant cavity for a surface acoustic wave on opposing sides of the transducers 114 and 116. An electrode 406 comprises an alternate configuration of the electrode 112. The electrode 406 in this example comprises a thin film of metal over the groove reflectors 404. A portion of the piezoelectric layer 110 under the groove reflectors 404 and electrodes 112 is biased by the DC voltage bias source 104 to adjust the frequency of resonance of the tunable resonator 402, as will be appreciated by those skilled in the art.

Figure 5:
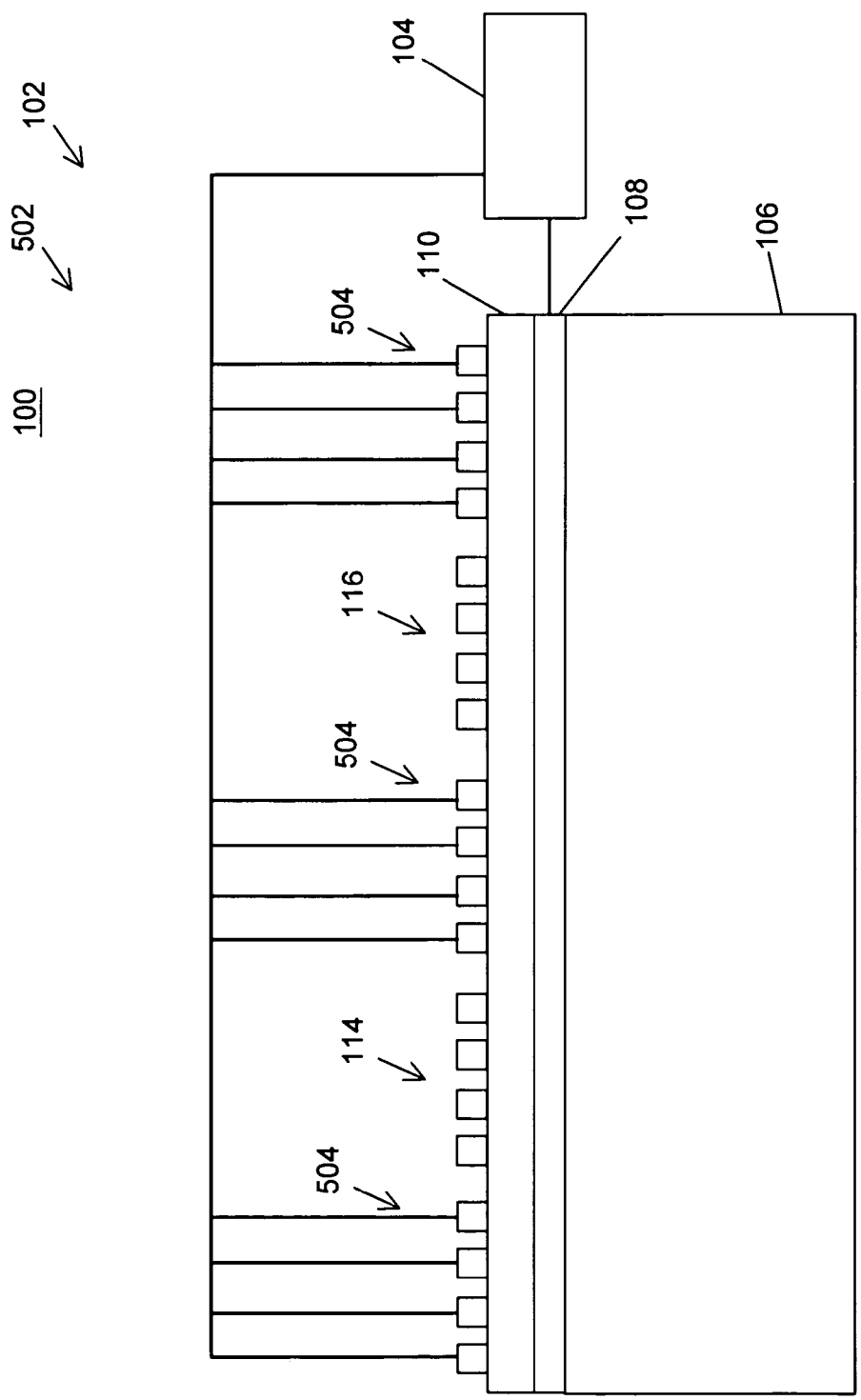
FIG. 5 is a representation of another implementation of the surface acoustic wave device that comprises a tunable resonator.

Turning to FIG. 5, the SAW device 102 in yet another configuration comprises a tunable resonator 502. The tunable resonator 502 comprises an alternate configuration of the reflectors, for example, conducting reflectors 504. The conducting reflectors 504 in one example comprise reflectors made of metal or other conductive material. In this example, the conducting reflectors 504 comprise the electrode 112 to receive the voltage bias.

Figure 6:
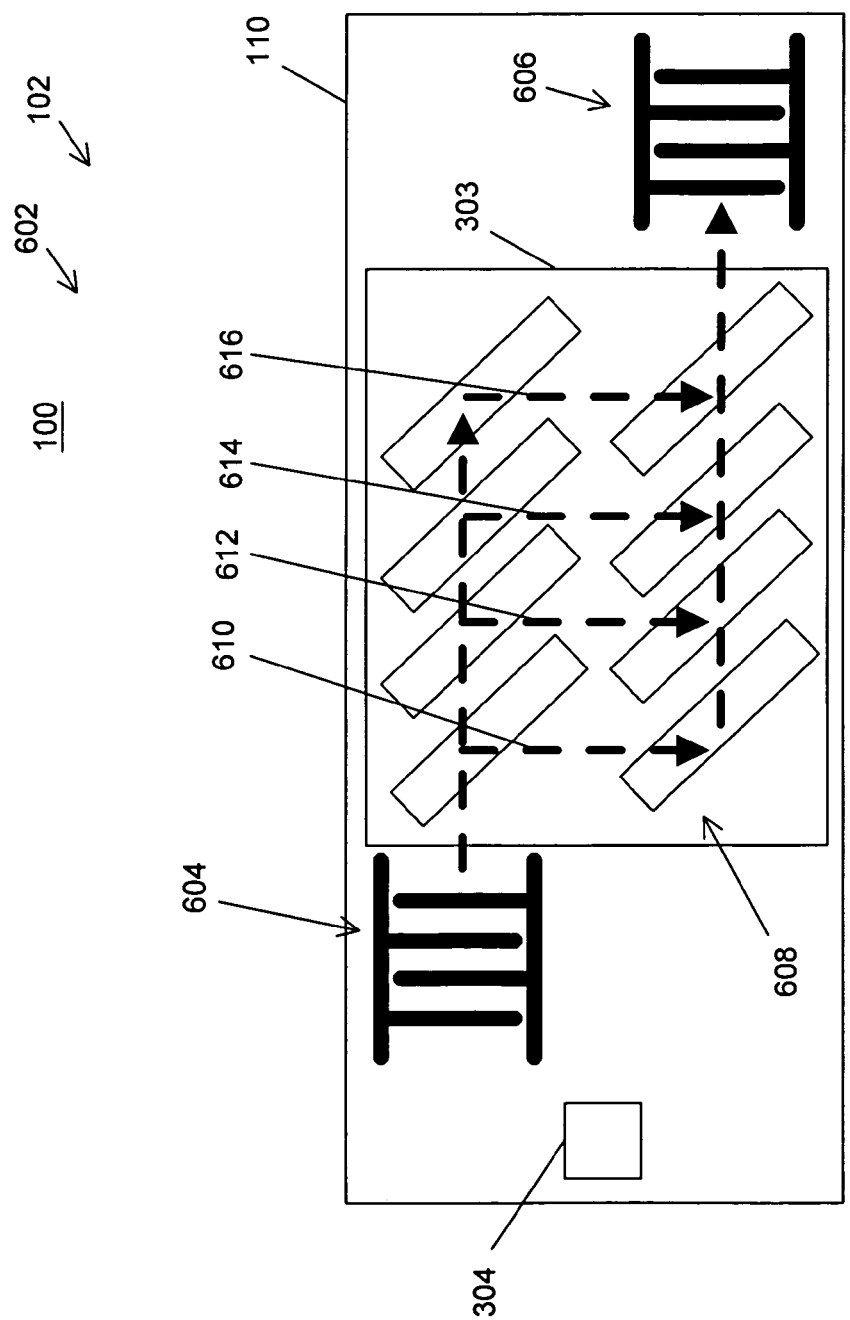
FIG. 6 is a top view representation of one implementation of the surface acoustic wave device that comprises a tunable filter.
Figure 7:
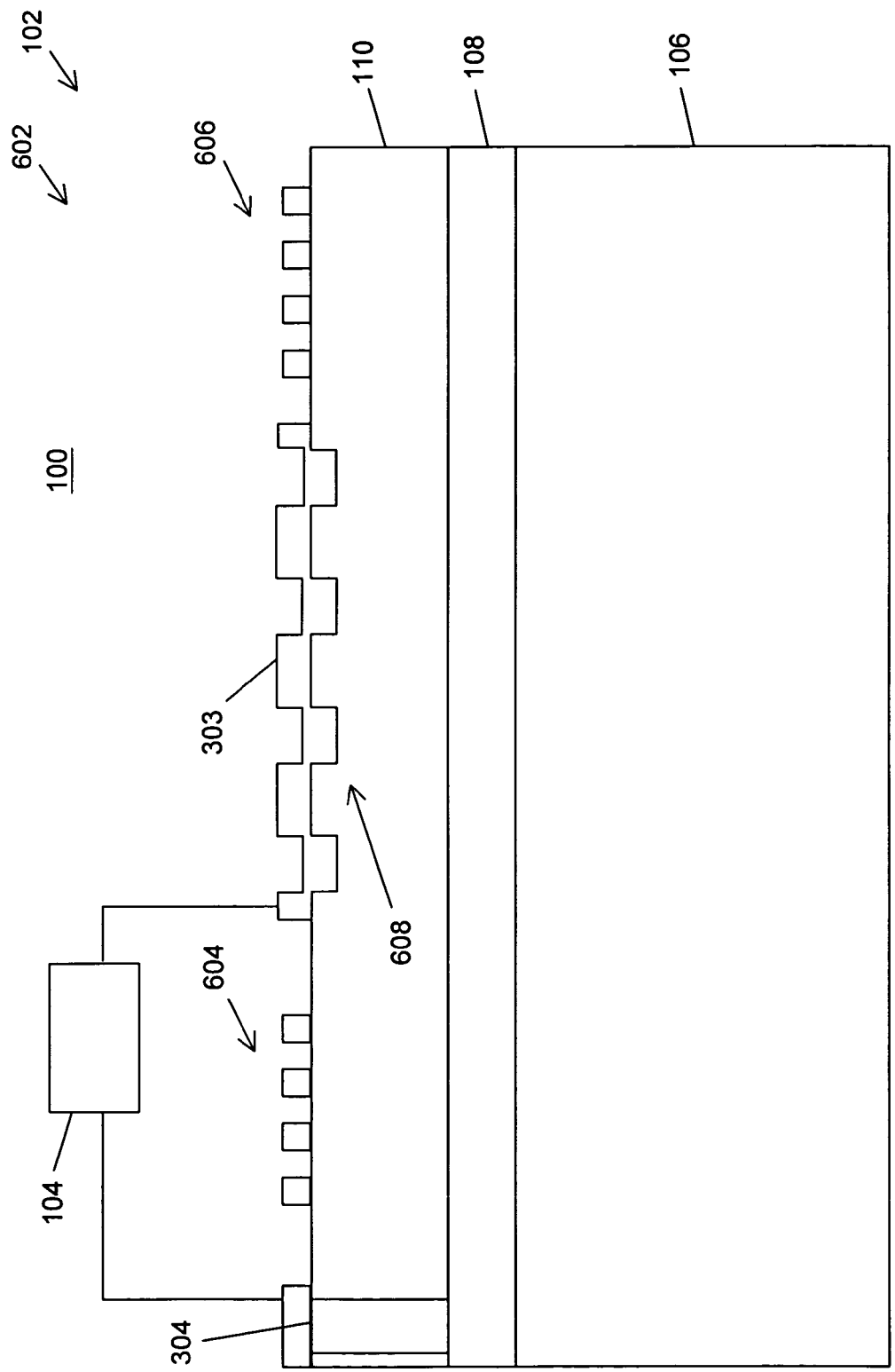
FIG. 7 is a side view representation of the tunable filter of FIG. 6.

Turning to FIGS. 6 and 7, the SAW device 102 in another configuration comprises a tunable filter 602. The tunable filter 602 in one example comprises a wideband input transducer 604, a wideband output transducer 606, and a plurality of groove arrays 608. The groove arrays 608 in one example comprise frequency selective groove arrays. The groove arrays 608 are covered by the electrode 303 for receiving the voltage bias. The wideband input transducer 604 converts an electrical signal to a surface acoustic wave that travels through the SAW device 102 towards the groove arrays 608. The grooves arrays 608 in one example are made (e.g., etched) in the piezoelectric layer 110. The electrode 303 is then formed over the groove arrays 608. In one example, the electrode 303 comprises a metal that is evaporated over the groove arrays 608. In this example, the evaporation of the metal is directional from a point above the surface of the piezoelectric layer 110, therefore the groove pattern on the piezoelectric layer 110 is replicated in the top of the electrode 303. The groove arrays 608 substantially reflect a selected surface acoustic wave along one or more paths 610, 612, 614 and/or 616 towards the wideband output transducer 606. Adjusting the voltage bias to the electrodes 108 and 303 will adjust a center frequency and/or passband frequency of the reflecting groove arrays and therefore the tunable filter 602, as will be appreciated by those skilled in the art.

An illustrative description of one method available to make the SAW device 102 in the configurations of FIGS. 3-7 is now presented, for explanatory purposes. The layers 108 and 110 in one example are formed together as an integral layer on the substrate 106. For example, the layers 108 and 110 are deposited as a thin film on the substrate 106. The layers 108 and 110 in one example are formed as a single integral crystal on the substrate 106 by molecular beam epitaxy. Forming the layers 108 and 110 as a single integral crystal in one example produces a piezoelectric layer with a strong level of piezoelectricity. The molecular beam epitaxy machine allows adjustments to the level of dopants added to the base material (e.g., gallium nitride) as the thin film is deposited, as will be appreciated by those skilled in the art. Materials such as gallium nitride are both piezoelectric and semiconducting. Therefore, they can be controlled to be either highly insulating to take advantage of the piezoelectricity, or partly conductive to serve as electrodes.

The first layer to be deposited on the substrate 106 is the electrode 108. The layers 108 and 110 in one example are gallium nitride layers. Undoped gallium nitride is a substantially insulating material. To increase the conductivity of the electrode 108, the molecular beam epitaxy machine is set to add a light level of doping to the gallium nitride while the electrode 108 is being deposited. The amount of dopant added to the gallium nitride for the electrode 108 is sufficient to make the electrode 108 conductive enough to receive a voltage bias and create the electric field in the piezoelectric layer 110. The lightly doped gallium nitride is deposited on the substrate 106 to achieve a slightly conductive electrode of the desired thickness. In one example, the thickness of the electrode 108 is 1000 angstroms.

After the electrode 108 has been created on the substrate 106, the added dopant level of the molecular beam epitaxy machine is reduced. In one example, the molecular beam epitaxy machine is set to add no dopant to the gallium nitride while the piezoelectric layer 110 is being deposited. Next, the gallium nitride free of dopants is deposited on the electrode 108 to achieve an insulating layer of the desired thickness. In one example, the thickness of the piezoelectric layer 110 is one micrometer.

After the piezoelectric layer 110 has been created on the electrode 108, in one example the groove reflectors 404 are formed in the piezoelectric layer 110 (FIGS. 4, 6, and 7). The groove reflectors 404 in one example are cut with an ion milling process or a plasma etching process. A layer of metal for the electrode 303, 406, and/or reflector 504 is then formed on the piezoelectric layer 110 (FIGS. 3 and 5) or on the groove reflectors 404 (FIGS. 4, 6, and 7). The layer of metal in one example is formed with a metal evaporation process. The thickness of the layer of metal in one example is 1000 angstroms.

The input and output transducers 114 and 116 (FIGS. 3-5) or wideband input and output transducers 604 and 606 (FIGS. 6-7) in one example are added to the piezoelectric layer 110. In one example, the transducers 114, 116 or 604, 606 are formed with a metal evaporation process. The electrodes 303, 406, reflector 504, and transducers 114, 116 or 604, 606 in one example are formed during a single session of the metal evaporation process to reduce a number of steps for the construction of the SAW device 102, as will be appreciated by those skilled in the art. The DC voltage bias source 104 is electrically coupled with the electrodes 108, 303, 406, the reflectors 504, and/or the transducers 114, 116, 604, and 606. For example, an electrical path is provided between the DC voltage bias source 104 and the electrodes 108, 303, 406, reflector 504, and/or the transducers 114, 116, 604, and 606. The via 304 in one example is used to allow connection to the electrode 108 and/or other lower level electrodes.

Numerous alternative implementations of the present invention exist. In one example, the electrode 108 comprises a metal layer, pad, or strip. The electrode stack 204 (or a topmost electrode stack) in one example comprises the alternate configuration for the electrode 112 as shown in FIG. 3. The electrode stacks 202 and 204 in another example comprise one or more vias 304 for connection to the DC voltage bias source 104. In another example, the electrode stack 202 is biased with a first voltage source and the electrode stack 204 is biased with a second voltage source. The input and output transducers 114 and 116 in another example may be biased for additional adjustment. In one example, the transducers 114 and 116 are biased from a same voltage source as the electrodes 108 and 112. In another example, the electrodes 108 and 112 are biased from a first voltage source and the transducers 114 and 116 are biased from a second voltage source. In this example, the transducers 114 and 116 may be biased with a higher or lower voltage than the electrodes 108 and 112. For example, the transducers 114 and 116 may be biased by twice the voltage of the electrodes 108 and 112.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
a piezoelectric layer;
a first electrode along a first side of the piezoelectric layer; and
a second electrode along a second side of the piezoelectric layer;
wherein the piezoelectric layer is between the first electrode and the second electrode;
wherein the first and second electrodes are adapted to receive a voltage bias to create an electric field in the piezoelectric layer between the first and second electrodes that controls an acoustic velocity of a surface acoustic wave;
wherein the piezoelectric layer comprises a piezoelectric material that is substantially insulating;
wherein the first and second electrodes comprise slightly conductive doped layers of the piezoelectric material;
wherein a solid comprises the piezoelectric layer, the first electrode, and the second electrode;
the apparatus further comprising an input transducer and an output transducer, wherein the surface acoustic wave travels along a surface of the solid from the input transducer to the output transducer;

wherein the input and output transducers are located on the first electrode;

wherein the first electrode is configured to receive the voltage bias to create the electric field in the piezoelectric layer;

wherein the first electrode is configured to prevent a short circuit between adjacent fingers of the input and output transducers and to reduce damping of the surface wave through induced electrical currents.

2. The apparatus of claim 1, wherein the first and second electrodes abut the piezoelectric layer.

3. The apparatus of claim 1, wherein a change to the voltage bias received between the first electrode and the second electrode results in a change in strength of the electric field in the piezoelectric layer and a change to the acoustic velocity of the surface acoustic wave.

4. The apparatus of claim 1, wherein the first electrode, the piezoelectric layer, and the second electrode are formed together as an integral layer on a substrate;

wherein the second electrode is formed on the substrate, wherein the piezoelectric layer is formed on the second electrode, wherein the first electrode is formed on the piezoelectric layer;

wherein when the first and second electrodes are at a same voltage level, then the acoustic velocity of the surface acoustic wave is at a baseline velocity;

wherein when the first electrode is at a voltage level that is higher than a voltage level at the second electrode, then the electric field is directed from the first electrode to the second electrode and the acoustic velocity of the surface acoustic wave is higher than the baseline velocity for a first polarity of the piezoelectric layer and is lower than the baseline velocity for a second polarity of the piezoelectric layer;

wherein when the first electrode is at a voltage level that is lower than a voltage level at the second electrode, then the electric field is directed from the second electrode to the first electrode and the acoustic velocity of the surface acoustic wave is lower than the baseline velocity for the first polarity of the piezoelectric layer and is higher than the baseline velocity for the second polarity of the piezoelectric layer.

5. The apparatus of claim 1, wherein the piezoelectric layer, the first electrode, and the second electrode are formed together as an integral layer on a substrate;

wherein the integral layer comprises a material with piezoelectric and semiconductor properties.

6. The apparatus of claim 5, wherein the first electrode is located in a first portion of the integral layer, wherein the first portion is doped for increased conductivity;

wherein the second electrode is located in a second portion of the integral layer, wherein the second portion is doped for increased conductivity;

wherein the piezoelectric layer is located in an insulating portion of the integral layer between the first and second electrodes.

7. The apparatus of claim 5, wherein the material comprises gallium nitride or aluminum nitride, wherein the substrate comprises sapphire or silicon carbide.

8. The apparatus of claim 1, wherein the piezoelectric layer, the first electrode, and the second electrode are formed together as a single crystal on a substrate;

wherein a first portion of the single crystal that serves as the first electrode is doped for increased conductivity, wherein a second portion of the single crystal that serves as the second electrode is doped for increased conductivity.

9. The apparatus of claim 1, wherein the first and second electrodes are adapted to create an adjustable electric field in the piezoelectric layer for tuning a center frequency of a surface acoustic wave device that propagates the surface acoustic wave.

10. The apparatus of claim 1, further comprising one or more reflectors to form a surface acoustic wave resonator;

wherein the first and second electrodes are adapted to receive the voltage bias to create the electric field in the piezoelectric layer that controls a center frequency of the surface acoustic wave resonator.

11. The apparatus of claim 10, wherein a change to the voltage bias received between the first electrode and the second electrode results in a change in strength of the electric field in the piezoelectric layer and a change to the center frequency of the surface acoustic wave resonator.

12. The apparatus of claim 1, further comprising a plurality of electrode stacks;

wherein the plurality of electrode stacks comprise a first and a second electrode stack;

wherein the piezoelectric layer comprises a first piezoelectric layer;

wherein the first electrode stack comprises the first electrode, the first piezoelectric layer, and the second electrode;

wherein the second electrode stack comprises a third electrode, a second piezoelectric layer, and a fourth electrode;

wherein the first and second electrodes are adapted to receive a first voltage bias to create a first electric field in the first piezoelectric layer that controls an acoustic velocity of a surface acoustic wave;

wherein the third and fourth electrodes are adapted to receive a second voltage bias to create a second electric field in the second piezoelectric layer that controls the acoustic velocity of the surface acoustic wave.

13. The apparatus of claim 12, further comprising:

a stack insulator that insulates the second electrode of the first electrode stack from the third electrode of the second electrode stack;

wherein the stack insulator comprises a non-piezoelectric insulating material or an insulating piezoelectric material that has a weaker piezoelectric effect than the first and second piezoelectric layers.

14. The apparatus of claim 1, further comprising an input transducer and an output transducer formed on the piezoelectric layer, wherein the first electrode is formed on the piezoelectric layer between the input transducer and the output transducer;

wherein the surface acoustic wave travels from the input transducer to the output transducer.

15. The apparatus of claim 14, wherein first electrode is formed between the input transducer and the output transducer on a top surface of the piezoelectric layer.

16. The apparatus of claim 14, wherein the piezoelectric layer, the first electrode, the second electrode, the input transducer, and the output transducer form an adjustable surface acoustic wave delay line.

17. The apparatus of claim 1, further comprising one or more reflectors formed on the piezoelectric layer;

wherein the one or more reflectors form an acoustic resonant cavity for the surface acoustic wave;

the apparatus further comprising an input transducer and an output transducer formed on a top surface of the piezoelectric layer and between the one or more reflectors.

18. The apparatus of claim 17, wherein the one or more reflectors comprise one or more etched groove mechanical reflectors;
wherein the first electrode is formed on the one or more etched groove mechanical reflectors.

19. The apparatus of claim 17, wherein the one or more reflectors comprise one or more conducting reflectors;
wherein the conducting reflector comprises the first electrode.

20. The apparatus of claim 1, further comprising a wideband input transducer and a wideband output transducer formed on the piezoelectric layer; and
a plurality of groove arrays formed on the piezoelectric layer between the wideband input transducer and the wideband output transducer;
wherein the first electrode is formed on the plurality of groove arrays;
wherein the wideband input transducer sends the surface acoustic wave towards the plurality of groove arrays;
wherein the plurality of groove arrays direct waves of selected frequency towards the output transducer;
wherein the piezoelectric layer, the first electrode, the second electrode, the wideband input transducer, the wideband output transducer, and the plurality of groove arrays form a tunable filter;
wherein the plurality of groove arrays and the first and second electrodes select a center frequency of the surface acoustic wave tunable filter.

21. The apparatus of claim 1, wherein a resistivity of the first and second electrodes is at least ten times lower than a resistivity of the piezoelectric layer.

22. The apparatus of claim 21, wherein the first and second electrodes comprise a sheet resistivity of approximately $1 \times 10^8$ ohms per square.

23. A method, comprising the steps of:
introducing a surface acoustic wave into a solid that comprises a piezoelectric layer, wherein the piezoelectric layer is substantially insulating; and
applying a voltage bias between a first electrode along a first side of the piezoelectric layer and a second electrode along a second side of the piezoelectric layer to create an electric field in the piezoelectric layer that controls an acoustic velocity of the surface acoustic wave;
wherein the first and second electrodes comprise slightly conductive doped layers of the piezoelectric material;
wherein the surface acoustic wave travels alone a surface of the solid from an input transducer to an output transducer located on the first electrode;
wherein the first electrode is configured to receive the voltage bias to create the electric field in the piezoelectric layer;
wherein the first electrode is configured to prevent a short circuit between adjacent fingers of the input and output transducers and to reduce damping of the surface wave through induced electrical currents.

24. The method of claim 23, wherein a surface acoustic wave device propagates the surface acoustic wave, wherein the step of applying the voltage bias comprises the step of:
applying an adjustable voltage bias to the first electrode or the second electrode to create an adjustable electric field in the piezoelectric layer for tuning a center frequency of the surface acoustic wave device.

25. The method of claim 23, wherein when the first and second electrodes are at a same voltage level, then the acoustic velocity of the surface acoustic wave is at a baseline velocity;
wherein the step of applying the voltage bias comprises the steps of:
applying a higher voltage level at the first electrode than the second electrode for a first polarity of the piezoelectric layer or the higher voltage level at the second electrode than the first electrode for a second polarity of the piezoelectric layer, if a desired acoustic velocity level is above the baseline velocity, to raise the acoustic velocity of the surface acoustic wave above the baseline velocity; and
applying the higher voltage level at the second electrode than the first electrode for the first polarity of the piezoelectric layer or the higher voltage level at the first electrode than the second electrode for the second polarity of the piezoelectric layer, if the desired acoustic velocity level is below the baseline velocity, to lower the acoustic velocity of the surface acoustic wave below the baseline velocity.

* * * * *